(12) United States Patent
Boniface

(10) Patent No.: US 10,857,812 B2
(45) Date of Patent: Dec. 8, 2020

(54) METHOD AND INSTALLATION FOR COATING A BODY WITH FORMATION OF A STRUCTURED SURFACE

(71) Applicant: REYDEL AUTOMOTIVE B.V., KN Baarn (NL)

(72) Inventor: Jérôme Boniface, Santes (FR)

(73) Assignee: REYDEL AUTOMOTIVE B.V., KN Baarn (NL)

( * ) Notice: Subject to any disclaimer, the term of this patent is extended or adjusted under 35 U.S.C. 154(b) by 316 days.

(21) Appl. No.: 15/555,299

(22) PCT Filed: Mar. 11, 2016

(86) PCT No.: PCT/EP2016/055258
§ 371 (c)(1),
(2) Date: Sep. 1, 2017

(87) PCT Pub. No.: WO2016/142510
PCT Pub. Date: Sep. 15, 2016

(65) Prior Publication Data
US 2018/0056671 A1   Mar. 1, 2018

(30) Foreign Application Priority Data

Mar. 11, 2015 (FR) ..................... 15 52022

(51) Int. Cl.
*B41J 3/00* (2006.01)
*B41J 2/21* (2006.01)
(Continued)

(52) U.S. Cl.
CPC ........... *B41J 3/4073* (2013.01); *B41J 2/2114* (2013.01); *B41J 2/2117* (2013.01); *B41J 2/2121* (2013.01);
(Continued)

(58) Field of Classification Search
CPC .............................. B41J 2/2114; B41J 2/2132
See application file for complete search history.

(56) References Cited

U.S. PATENT DOCUMENTS 9,114,628 B2 * 8/2015 Sakai ..................... B41J 2/2132
2005/0068347 A1 * 3/2005 Inoue ........................ B41J 2/06
347/5

(Continued)

FOREIGN PATENT DOCUMENTS

DE    102009040959 A1    11/2010
DE    102011100554 A1     6/2012
(Continued)

OTHER PUBLICATIONS

International Search Report regarding PCT/EP2016/055258 dated Jun. 8, 2016.

*Primary Examiner* — Cachet I Proctor
(74) *Attorney, Agent, or Firm* — Dickinson Wright PLLC

(57) ABSTRACT

The present invention relates to a method for coating, optionally with specific colouring, an exposed surface of a body with simultaneous formation of a structured surface, including projecting formations, via a device for depositing one or more liquid substances in droplets, in particular by a jet, said method consisting, for each affected site (1″) of the surface to be printed (1'), of consecutively depositing at least two vertically adjacent layers (6, 6') of a first substance selected from the group made up of a size, a varnish, an adhesion or attachment agent and a coating agent, preferably white or transparent and at least one second substance such as a colouring substance or a mixture of colouring substances, each of the consecutive layers (6, 6') being formed by depositing droplets (4, 4'; 5). The method is characterised in that it consists of consecutively depositing at least three vertically adjacent layers (6, 6') which are made up, alternatively, of a first substance and a second substance, each layer (6, 6') being made up of separate individual droplets (4, 4'; 5), arranged in each layer according to a predetermined pattern.

20 Claims, 15 Drawing Sheets

(51) Int. Cl.
   *B41J 3/407*    (2006.01)
   *B41J 11/00*    (2006.01)
   *B44C 3/02*     (2006.01)
   *C23C 16/44*    (2006.01)
   *B05D 5/06*     (2006.01)
   *B05D 5/00*     (2006.01)
   *B05D 1/26*     (2006.01)

(52) U.S. Cl.
   CPC ............. *B41J 11/002* (2013.01); *B44C 3/025*
   (2013.01); *C23C 16/44* (2013.01); *B05D 1/26*
   (2013.01); *B05D 5/005* (2013.01); *B05D 5/06*
   (2013.01)

(56) References Cited

U.S. PATENT DOCUMENTS

| | | | | |
|---|---|---|---|---|
| 2006/0198964 A1* | 9/2006 | Kaiser | .................. | B41J 11/0015 427/487 |
| 2009/0091591 A1* | 4/2009 | Sivan | ..................... | B41M 3/148 347/9 |
| 2009/0322804 A1* | 12/2009 | Usuda | .................... | B41J 2/2114 347/6 |
| 2011/0148959 A1* | 6/2011 | Kato | ....................... | B41J 2/2132 347/9 |
| 2011/0274891 A1* | 11/2011 | De Rossi | ................. | B05D 5/06 428/195.1 |
| 2013/0021398 A1* | 1/2013 | Mizes | .................... | B41J 2/2114 347/14 |
| 2015/0042716 A1 | 2/2015 | Beier et al. | | |
| 2016/0297210 A1* | 10/2016 | Klemann | ............... | B41J 11/002 |
| 2017/0341419 A1* | 11/2017 | Hachmann | ........... | B41M 5/0017 |

FOREIGN PATENT DOCUMENTS

| | | |
|---|---|---|
| DE | 102012006371 A1 | 7/2012 |
| EP | 2196267 A2 | 6/2010 |
| EP | 2340937 A1 | 7/2011 |
| EP | 2777944 A1 | 9/2014 |
| JP | H0752525 A | 2/1995 |
| WO | 2007033031 A2 | 3/2007 |
| WO | 2008064248 A2 | 5/2008 |
| WO | 2010069286 A1 | 6/2010 |
| WO | 2011064075 A2 | 6/2011 |
| WO | 2013087058 A1 | 6/2013 |
| WO | 2015161093 A1 | 10/2015 |

* cited by examiner

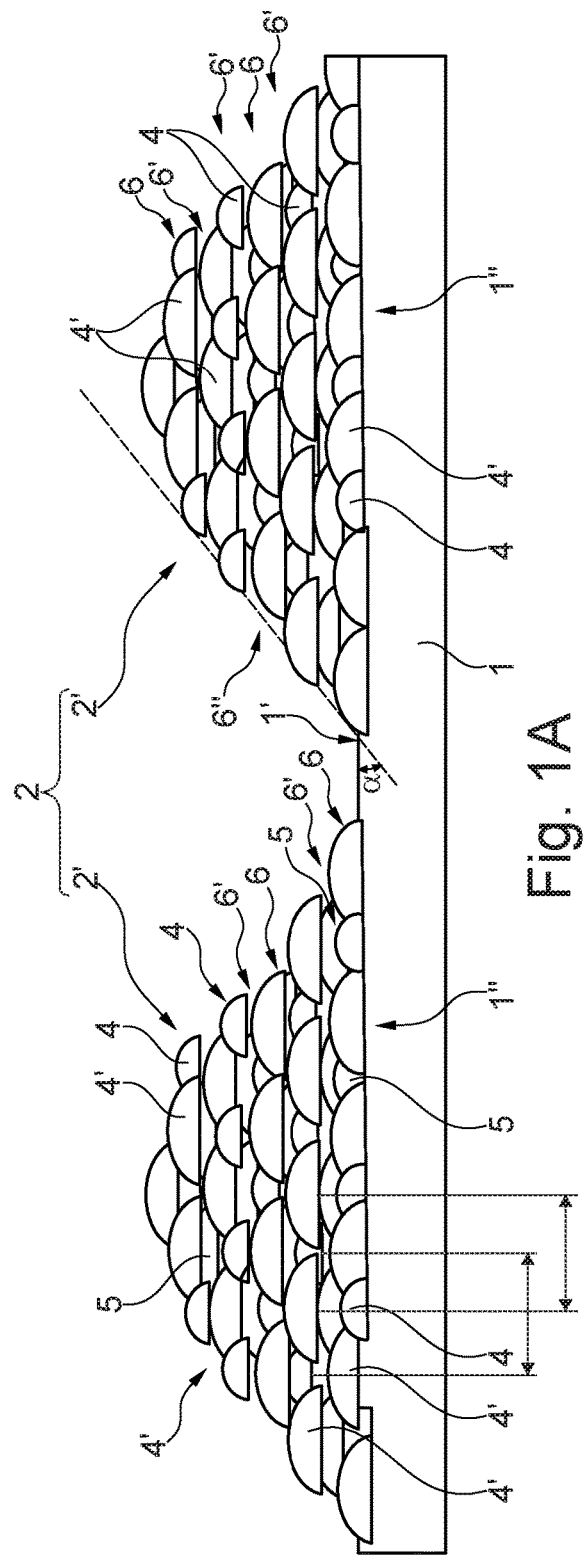
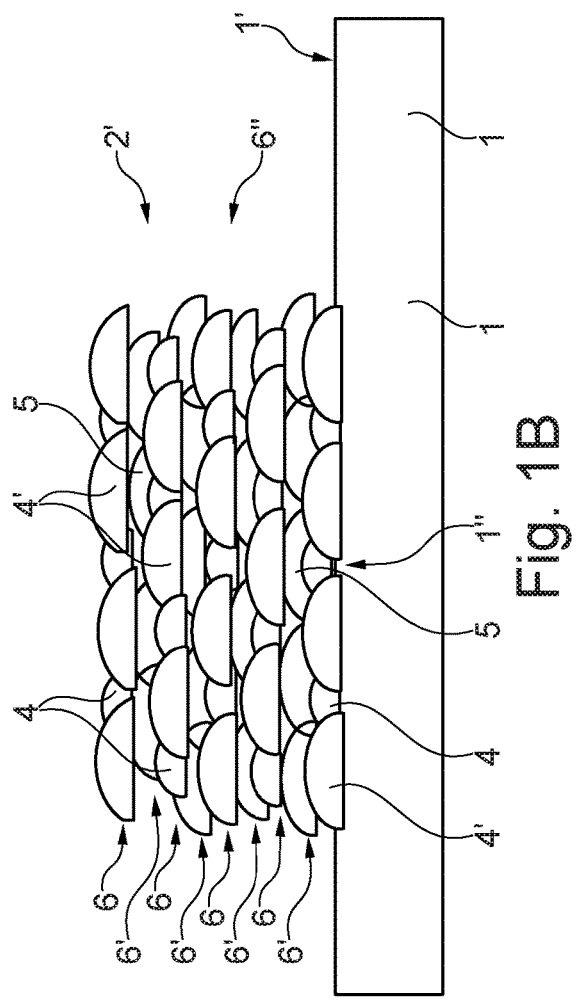
Fig. 1A
Fig. 1B

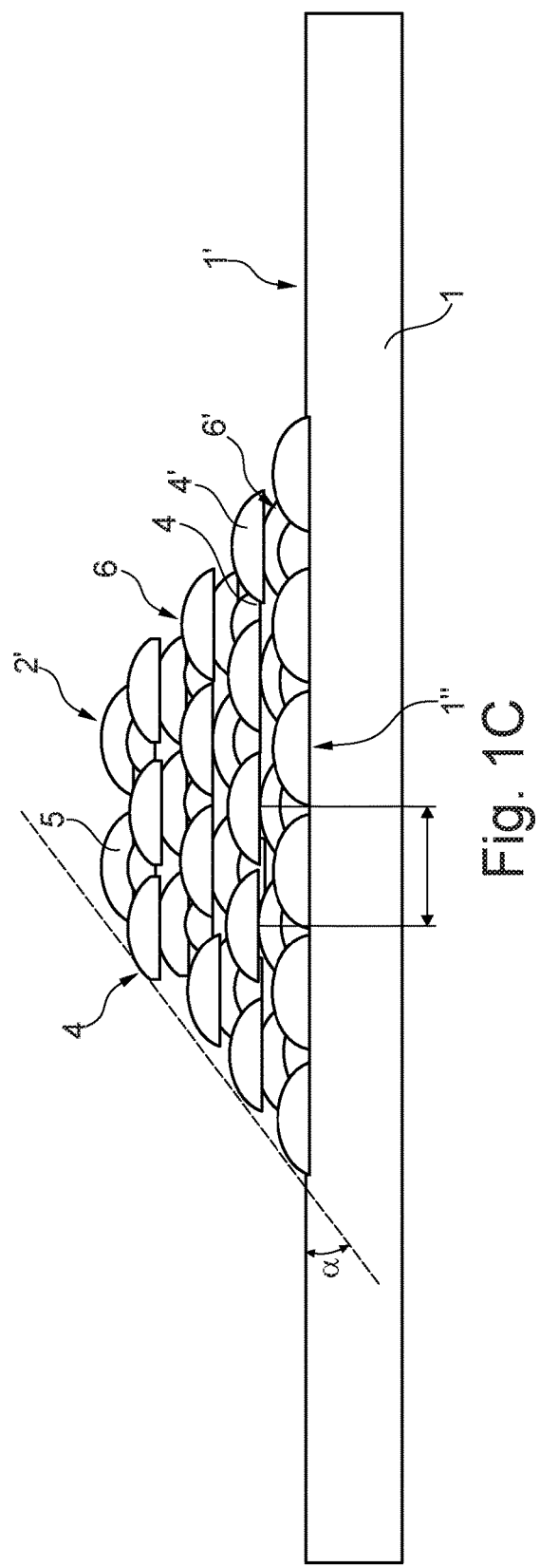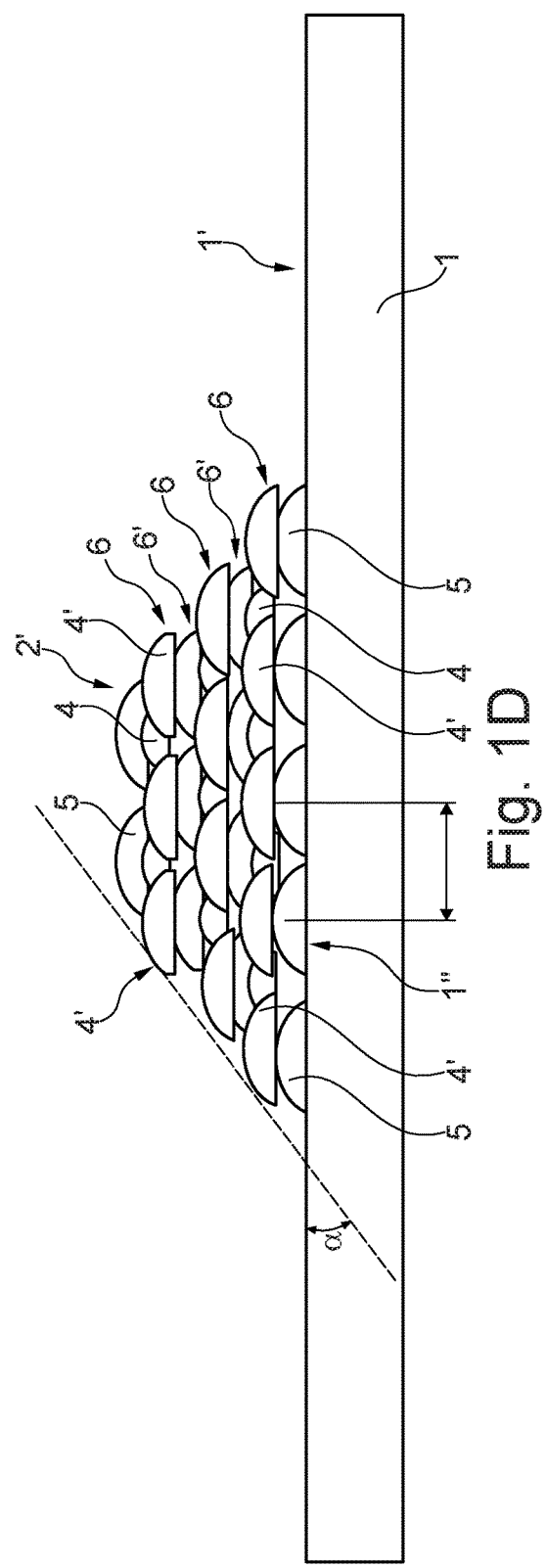

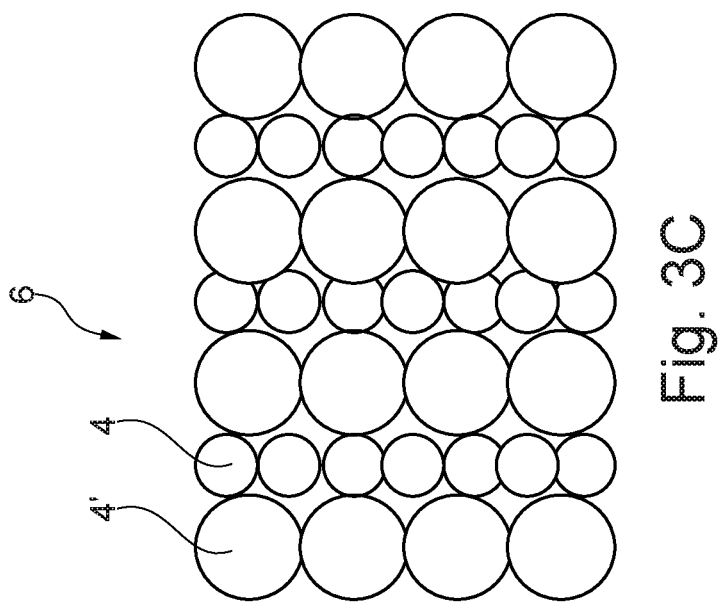
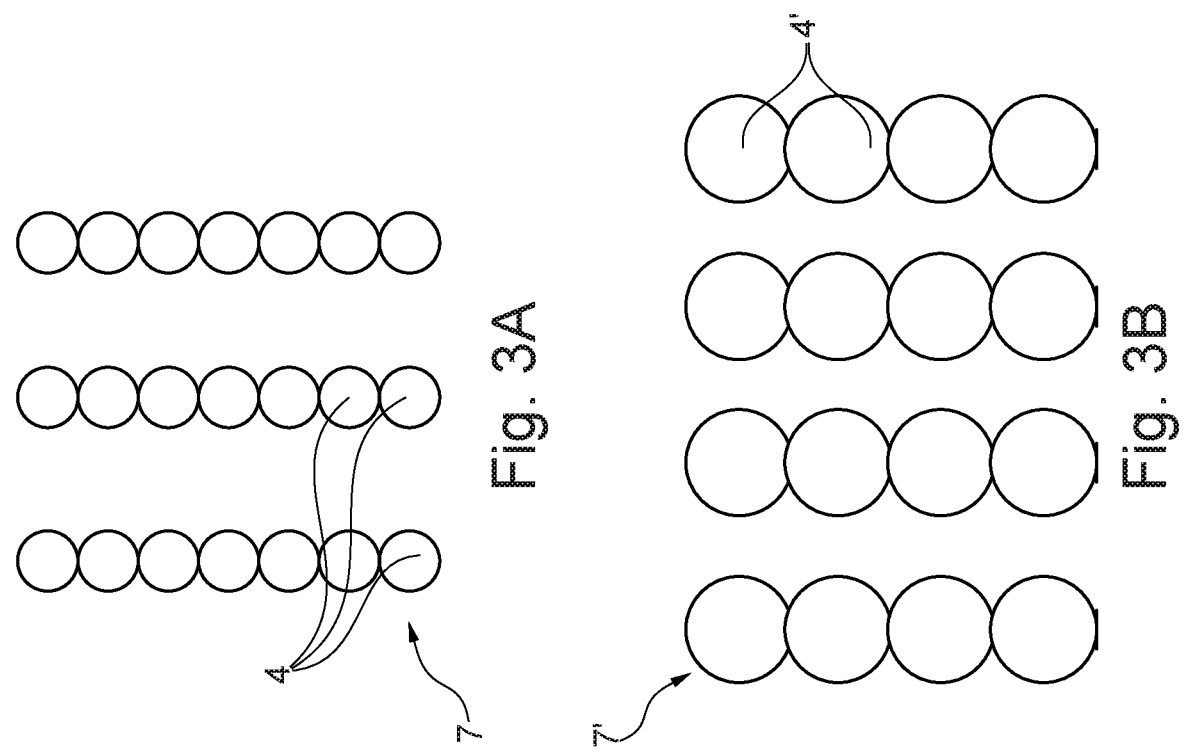

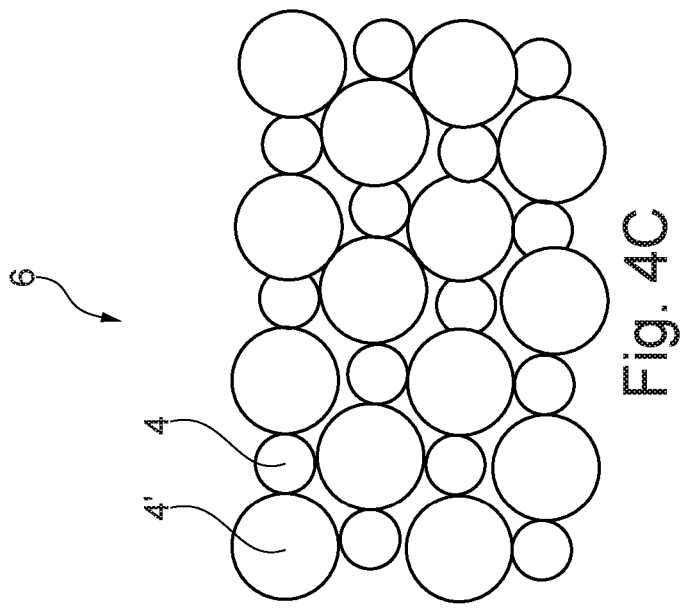
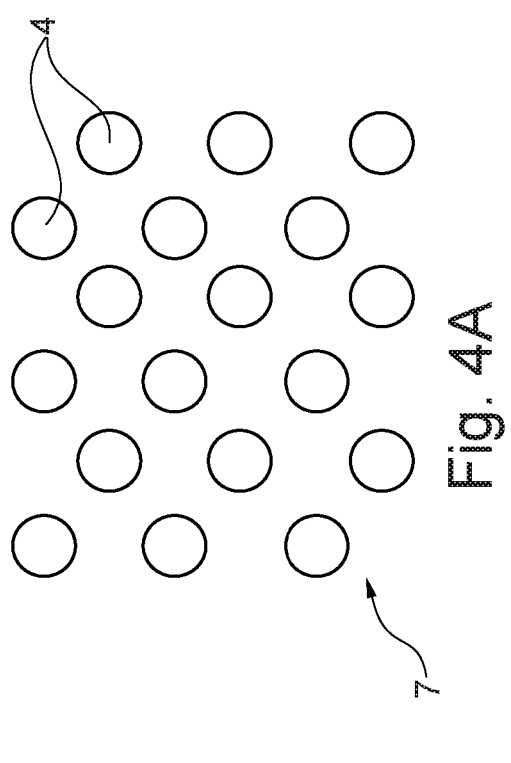
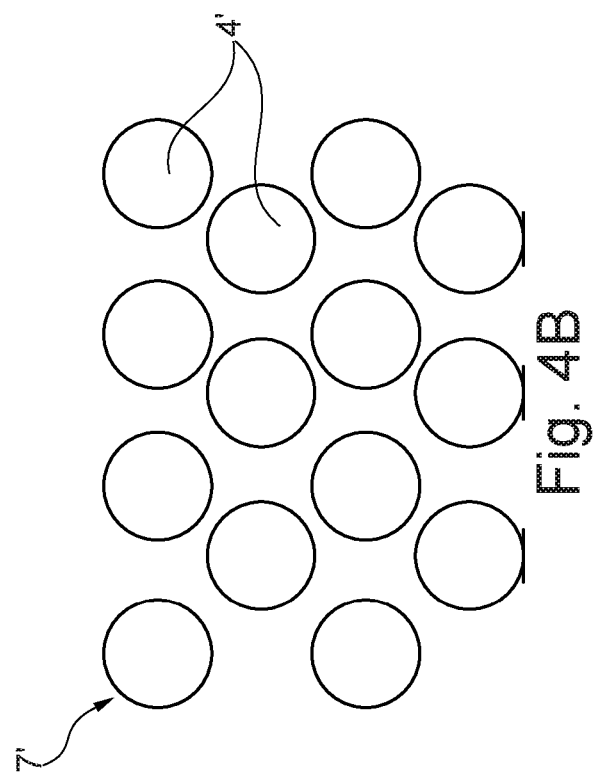

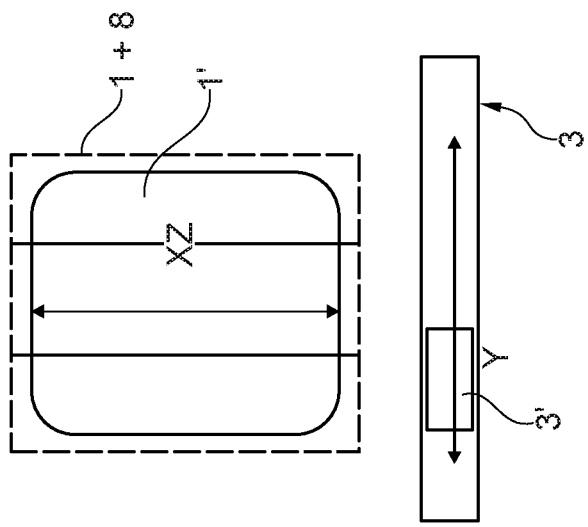
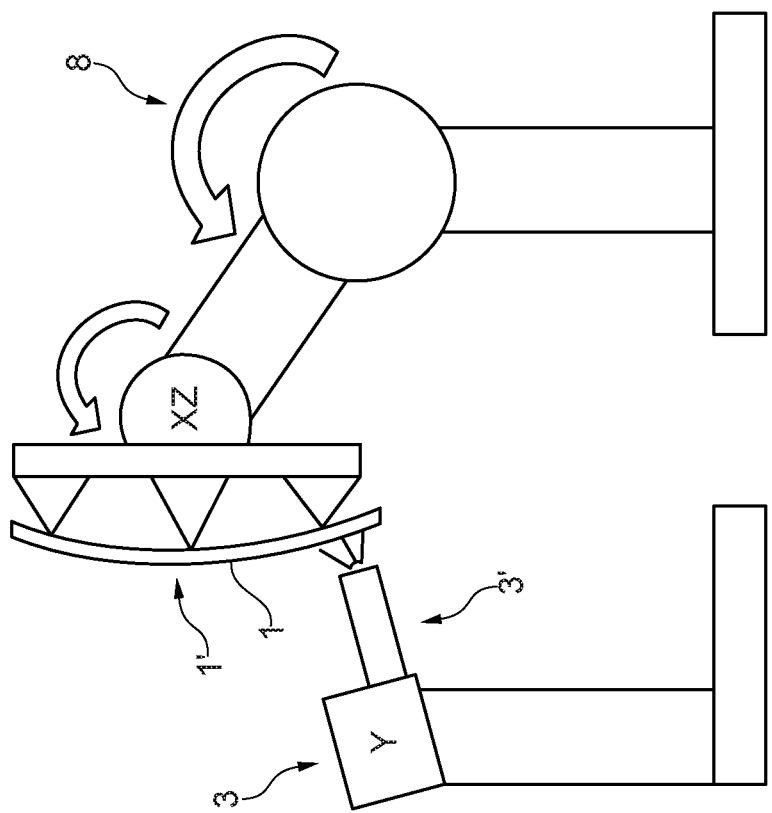

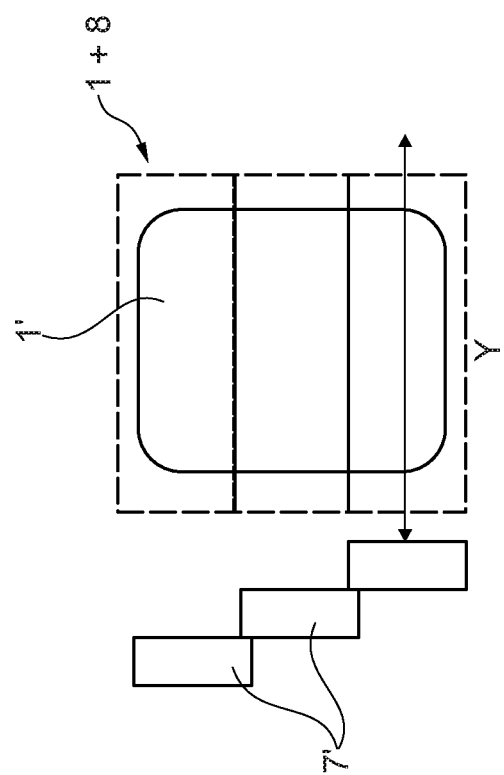
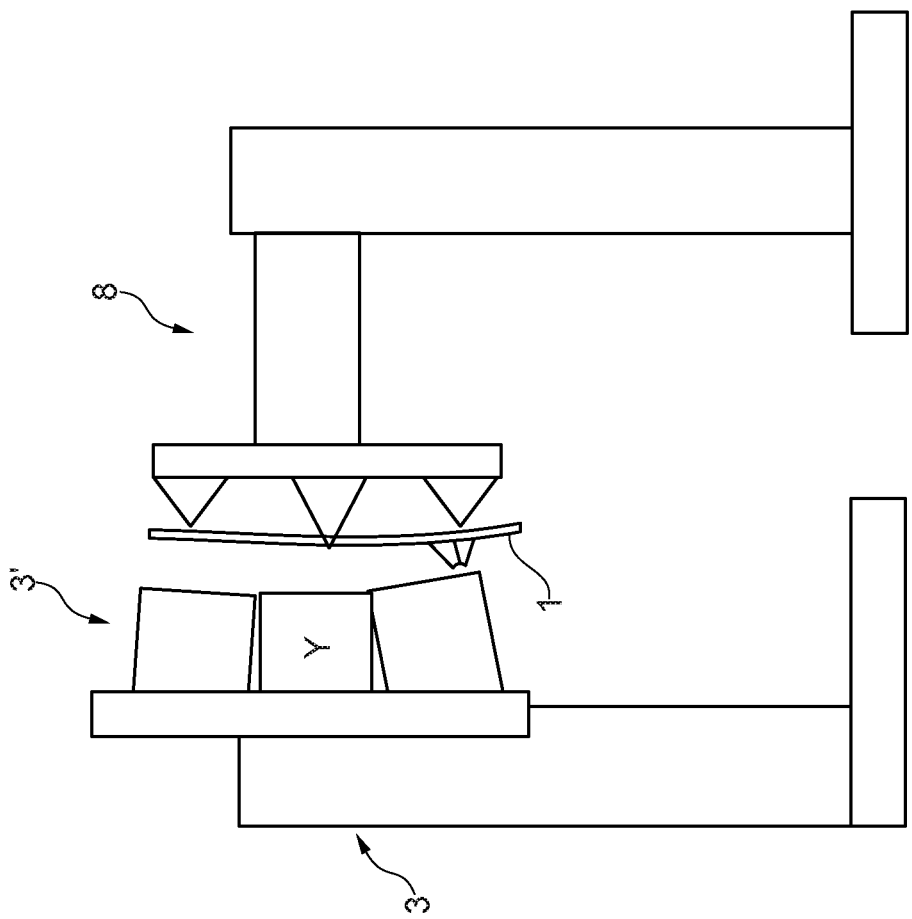
Fig. 9B
Fig. 9A

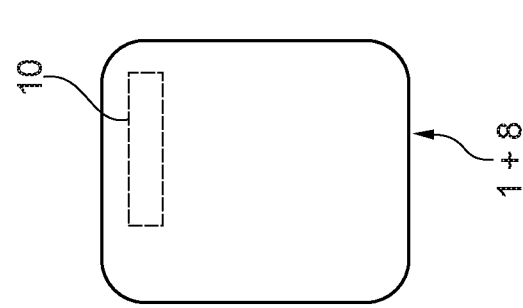
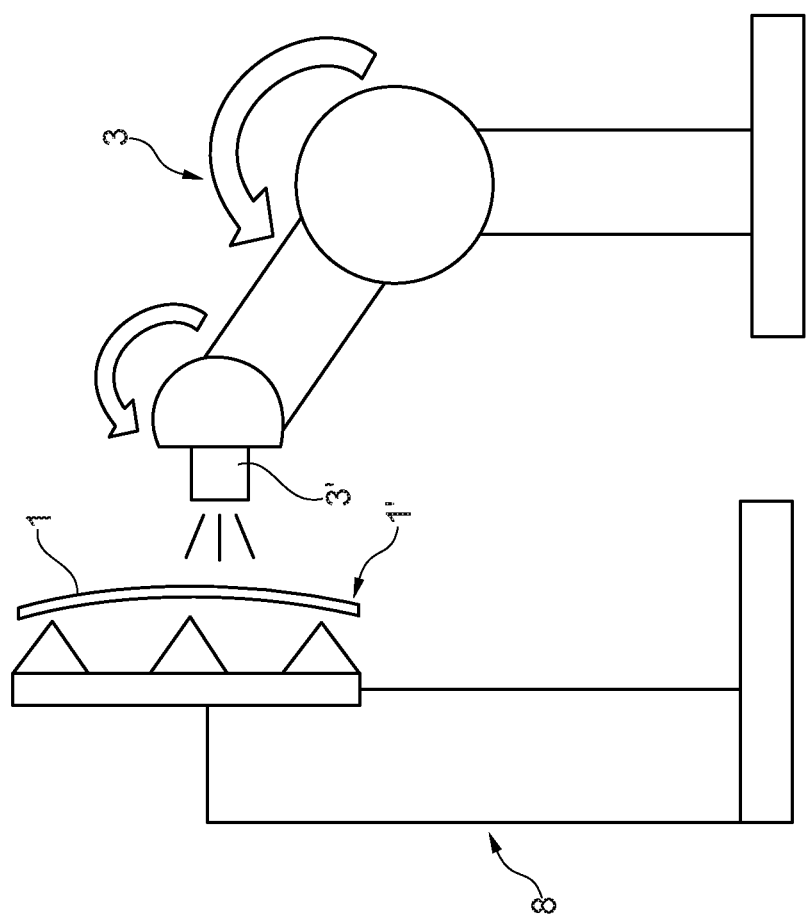
Fig. 10A
Fig. 10B

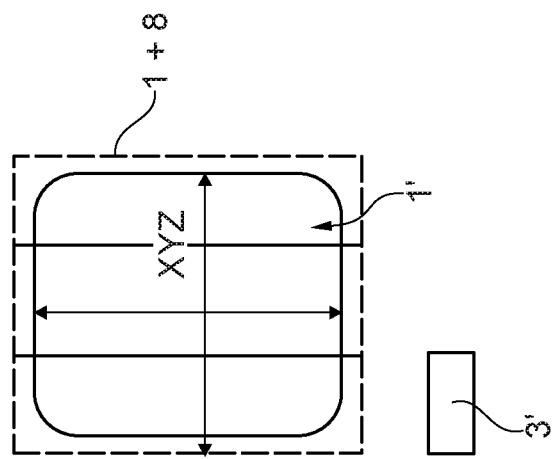
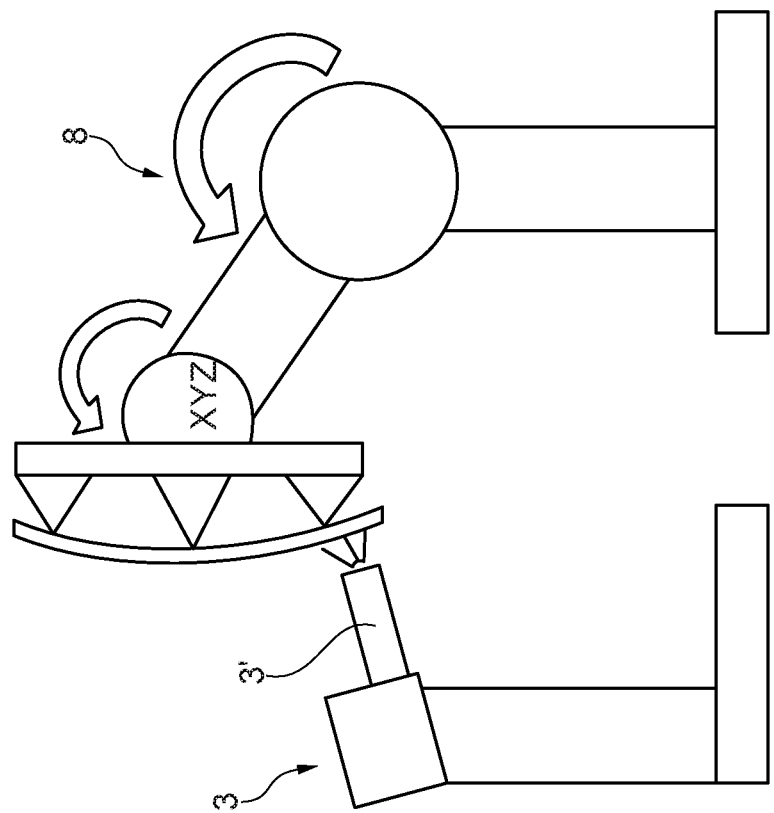
Fig. 11B
Fig. 11A

METHOD AND INSTALLATION FOR COATING A BODY WITH FORMATION OF A STRUCTURED SURFACE

This application is a 371 national phase entry of PCT/EP2016/055258, filed 11 Mar. 2016, which claims benefit of French Patent Application No. 1552022, filed 11 Mar. 2015, the entire contents of which are incorporated herein by reference for all purposes.

BACKGROUND

1. Field

The present invention relates to the context of surface coating, in particular in the field of dressing up or decoration parts for vehicle passenger compartments, and relates to a method for printing patterns and textures on a surface, an installation for the implementation of this method and a part obtained by this method.

2. Background

Currently, the demands in terms of surface appearance of parts are more and more varied and are no longer limited solely to considerations of visual appearance, but also incorporate effects related to touch and play with light (glitter, matte/glossy, moiré, . . . ), namely superficial surface states or surface textures which are pleasant and/or surprising to the touch and the eye.

The search for a matte and/or a matte/glossy effect, which softens the decoration, masks fingerprints and are easier to clean, is also timely.

In addition, there is also a desire to give the decor or the image visible on the surface a certain depth of field or 3D effect, as well as an increased color intensity.

Finally, another strong demand from manufacturers and users is for decorations that are more resistant to scratching and friction.

These trends have recently been developed in the field of decoration and dressing up parts for motor vehicles.

However, existing current techniques for making this type of surface are complex and costly and do not provide a quality product, in particular in terms of color intensity, which is durable over time.

These known techniques make use in particular of techniques of structured molding and of posterior coloration (with optionally a final layer of protective varnish), of printing on a skin with subsequent overmolding, of integrating splashes or colored patterns onto a skin, or transfer during the molding of the part.

There are also known techniques for ink jet printing of surfaces of complex three-dimensional shapes, for example according to documents WO 2008/064248, DE 10 2012 006 371, EP 2196 267, DE 10 2009 040 959, WO 2010/069286 and JPH 075 2525.

Nevertheless, the patterns, images, patterns or the like produced by these techniques do not provide any noticeable relief texture.

Methods are also known for forming surface reliefs by depositing successive layers in a manner similar to a 3D printing, these layers may or may not be colored.

Nevertheless, the means required are complex and costly and the choice of colors is restricted, thereby limiting the possibilities of visual rendition.

Finally, structured or textured surfaces can also be obtained by other techniques, either during molding of the part by using a suitably etched cast, either after molding the part by etching its surface with a laser or by applying a layer of paint or similar coloring substance containing particles or chemical compounds relating to each other to form particles, granules or similar concretions.

In addition to being able to provide only a monochrome surface, with a single specific brightness, the latter techniques are respectively non-flexible, time-consuming and uncontrollable (in terms of reliefs formed).

The lack of flexibility mentioned above relates in particular to the design, profile, shape, thickness and/or matte/glossy rendering of the texture or decoration obtained.

From documents EP 2 340 937 and WO 2007/033031, there are already known methods for ink jet printing, in which an image or an area printed or preprinted on a support is covered by one or more transparent varnish layers, thus forming an extra thickness with respect to the surface printed. This results in some protection of the print, but no noticeable improvement in color intensity, nor the provision of a specifically and precisely textured or structured surface, or a pronounced visual effect of depth.

SUMMARY

The object of the present invention is in particular to overcome the main disadvantages of the above-mentioned known solutions and to overcome their major limitations.

In particular, the invention aims to propose a solution which can lead to a coating or surface decoration capable of providing visual effects, namely a high color intensity and a certain depth of field or 3D effect, tactile effects, namely a bead or relief, structured and sufficiently pronounced to be perceptible to the touch, and above all, a high resistance to scratching and to abrasion by friction and tearing.

To this end, the object of the invention is a method of coating or covering, optionally with specific staining, of an apparent face of a body with simultaneous formation of a structured surface comprising protruding formations, in particular beaded or presenting a texture in relief or the like, by means of a device for depositing liquid substance(s) into droplets, in particular by jet, said method consisting of, for each relevant site of the face to be printed, successively depositing at least two superposed layers of a first selected substance, optionally depending on the characteristics of the face of the body to be printed, in the group formed by a primer, a varnish, an adhesion or bonding agent and a coating agent, preferably white or transparent, and at least one second substance of the dye substance type or a mixture of coloring substances, each of the successive layers being formed by depositing droplets, characterized in that it consists in successively depositing at least three superimposed layers which are constituted, alternately of a first substance and a second substance, each layer being formed of individual and distinct droplets arranged in each layer according to a predetermined pattern.

BRIEF DESCRIPTION OF THE DRAWINGS

The invention will be better understood, by way of the description below, which relates to preferred embodiments, given by way of non-limiting examples, and explained with reference to the accompanying schematic drawings, in which:

FIG. 1A is a cross-sectional view of two colored formations in relief with a triangular section and ten superimposed layers forming part of a textured surface attached to the visible face of a body or a part, by means of the method and installation according to the invention, the droplets forming the superimposed layers (ten layers) being represented schematically by way of illustration for better visualization of the production of the constituent layers;

FIG. 1B is a cross-sectional view similar to that of FIG. 1A, of a colored formation in relief, with rectangular section and nine superimposed layers, according to a variant embodiment of the invention;

FIGS. 1C and 1D are cross-sectional views similar to that of FIG. 1B, of colored formations in relief with truncated triangular sections, respectively eight and seven superimposed layers;

FIGS. 3A, 3B and 3C are top views respectively of two complementary depositing patterns (for depositing in two passes or successive phases) of droplets of coloring substance or of ink (FIGS. 3A and 3B) and of the pattern resulting from Droplets forming the layer concerned (FIG. 3C), in accordance with an embodiment of the invention;

FIGS. 4A, 4B and 4C are top views similar to those of FIGS. 3A to 3C respectively, of the two elementary and complementary depositing patterns of the two populations of droplets (FIGS. 4A and 4B) and of the final pattern for depositing the droplets of the layer in question (FIG. 4C), this in accordance with another embodiment of the invention;

FIGS. 6A, 7A, 8A, 9A, 10A and 11A are schematic representations of five variant embodiments of the two essential functional components of an installation for implementing the method according to the invention;

FIGS. 6B, 7B, 8B, 9B, 10B and 11B are schematic representations illustrating the relative displacement between the part to be printed and the device for depositing droplets of colored substance or the like, in relation to the installations shown in FIGS. 6A, 7A, 8A, 9A, 10A and 11A respectively, and, FIG. 12 is an elevation plan view of a part comprising embossed formations according to the invention, obtained by the method and by means of one of the installations according to the invention.

DETAILED DESCRIPTION OF EXAMPLE EMBODIMENTS

Figure 2A:
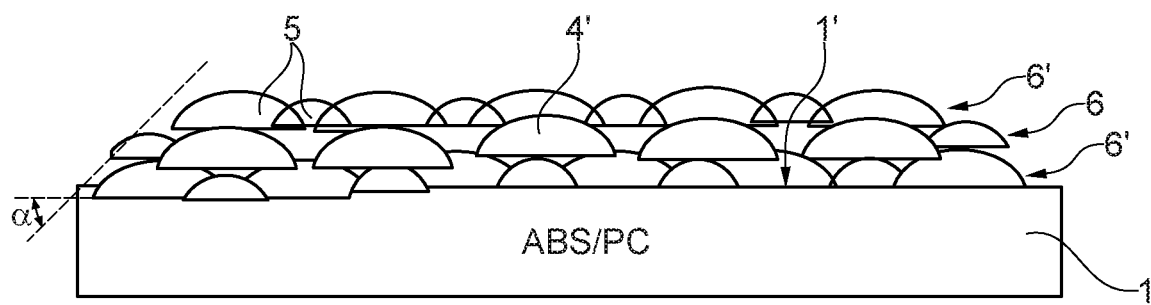
FIGS. 2A to 2D are cross-sectional views similar to those of FIGS. 1A and 1B, of superimposed three-layered formations in relief, either colored (FIGS. 2A to 2C—with various alternations of colored and transparent layers) or transparent (FIG. 2D—application of layers of the first substance only)
Figure 2B:
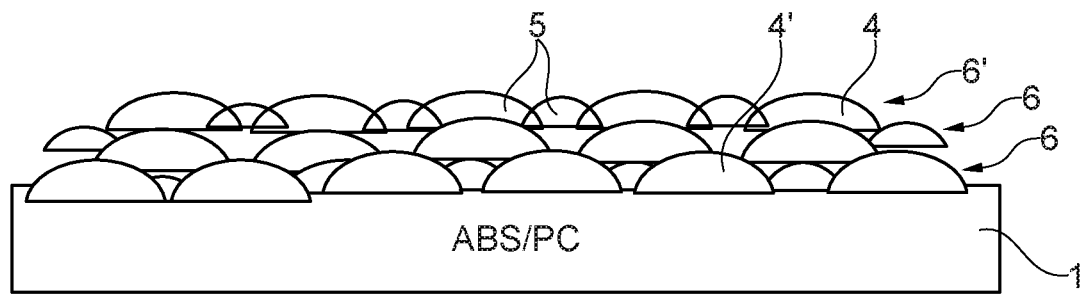
Figure 2C:
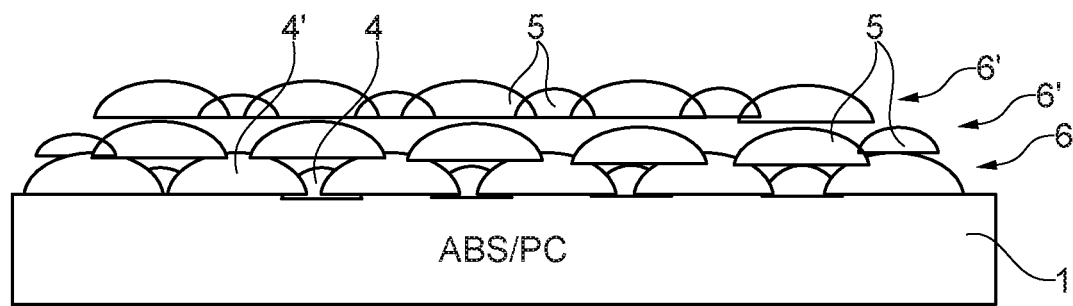

The figures of the accompanying drawings, and more particularly in FIGS. 3, 4 and 5, illustrate at least partially a coating or covering method, optionally with specific staining, of an apparent face 1' of a body 1 with simultaneous realization of a structured surface 2, comprising protruding formations or structures 2', in particular grained or showing relief texture or the like, this via a device 3 for depositing liquid substance(s) into droplets 4, 4', 5, in particular by jet.

In accordance with the invention, this process consists of, for each relevant site 1' of the printing face 1', of successively depositing at least two superimposed layers 6, 6' of a first selected substance, optionally as a function of the characteristics of the face of the body to be printed, in the group consisting of a primer, a varnish, an adhesion or bonding agent and a coating agent, preferably a white or transparent coating agent and at least one second substance of the coloring substance type, or mixture of coloring substances, each of the layers 6, 6' being formed by depositing droplets 4, 4'; 5 characterized in that it consists in depositing successively at least three superimposed layers 6, 6', which are constituted alternately of a first substance and a second substance, each layer 6, 6' being formed of droplets 4, 4'; 5, arranged in each layer according to a predetermined pattern 7, 7'.

After each depositing of layers 6, 6', a (preferably active) phase of drying/curing/polymerization more or less forced is advantageously carried out, the degree of drying/curing/polymerization depending for example on the nature of the substance deposited last and/or on the row of the layer 6, 6' considered, as well as on the size of the droplets 4, 4', 5' and the desired consistency and adhesiveness for the latter, before the next layer is deposited.

The purpose of the invention, namely to provide a textured surface that is resistant, with visual and tactile effects, is thus achieved by implementing, with adequate operational adaptation, a simple process similar to that of a droplet projection printing, more commonly referred to as "inkjet printing."

The invention is therefore based on a relatively inexpensive, proven method of depositing which is well known to those skilled in the art.

In addition, the method according to the invention based on this depositing technique has numerous advantages, including in particular: great flexibility in terms of shape, profile, thickness and color of the decorative patterns and textures obtained, an elevated resistance to scratches, abrasion and friction, as well as the possibility of offering different degrees of gloss/matteness.

The combination of, on the one hand, the alternation of layers 6 of colored or coloring substance and functional and structuring layers 6' (interlocking, adhesion, aggregation, hardening, consolidation) and, on the other hand, by a constitution of individual and distinct droplets of each layer 6, 6' (ameliorated interlocking of the layers, non-smooth interfaces), enables the invention to result synergistically in structures or embossed colored formations, exhibiting very high resistance to tearing, abrasion, scratches, impact and impact and friction.

In addition, an improvement in the visual rendering, in particular a noticeable increase in the intensity of the colors, has also been observed, due in particular to the multiple superposition of colored layers.

There was also found a possibility of matteness control, resulting in controlled matte/glossy effects.

In accordance with a preferred embodiment and illustrated in FIGS. 1A, 1B, 1C, 1D, 2A to 2C and 5A to 5I, the various superimposed layers 6, 6', preferably with substantially continuous covering, in their depositing design, are constituted successively and alternately by a layer of transparent lacquer or resin 6' or the like, and a layer of coloring substance(s) 6, preferably at least partially opaque, such as ink filled with color pigments.

Figure 2D:
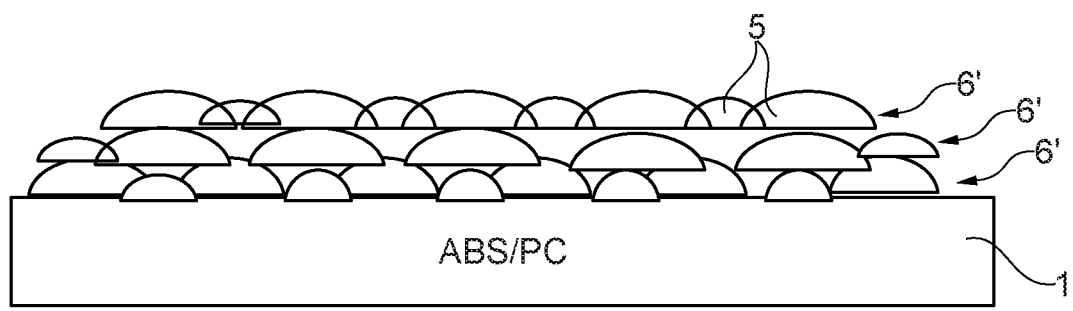

As shown by way of example of the result obtained, FIG. 2D, it can also be provided, without forming part of the invention, that all the layers 6; 6' are formed exclusively of a first transparent substance, with high adherence capability and having a high abrasion resistance and high hardness after solidification. This variant is suitable when the color, decorative pattern and surface condition of the visible face 1' of the body 1 must be conserved and be visible. The droplets 5 deposited according to a given mofif or depositing pattern at each layer 6' may be of the same size or at least two different sizes.

Depending on the nature and characteristics of the face 1', as well as the properties sought first, the first layer deposited on the latter may be a colored layer 6 or a functional layer 6' (transparent or otherwise).

Preferably, the first layer deposited on the face 1' to be coated, is a layer 6' formed of droplets 5 of the first substance, preferentially a substance providing an adhesion or an attachment reinforced with the material of the face 1'. Advantageously, in order to increase the visual rendering of the colors, this first layer 6' may be of a white or at least light color, the other layers 6' being transparent.

Advantageously, the last deposited layer, or topcoat, is a layer 6' formed of droplets 5 of the first or of a third substance, advantageously of varnish or transparent resin.

The substance forming this last layer is preferably of a type which makes it possible to produce a transparent protective coating, this substance being deposited, in terms of surface area and quantity, so as to encapsulate, in cooperation with the intermediate layers 6, all the previous layers 6, 6' (at the level of their edges), and thus the formation 2' considered (see FIGS. 1C, 1D and 2).

The intermediate functional layers 6' can advantageously overlay laterally with respect to the underlying colored layers 6, so as to cover the lateral borders (edges) of the latter and thus form, together, a protective layer on the flanks of the protruding formations 2'.

All the layers 6' deposited after the first layer 6 of coloring substance(s) are transparent in nature. In this way, all the layers 6 participate in the color rendering.

The same substance, for example of the transparent varnish type, can of course form the first bonding layer 6', the intermediate functional layers 6' and the last protective layer 6'.

Nevertheless, the first layer 6' may also consist of a specific layer of bonding primer (for example white), different from the transparent intermediate layers 6' (interposed between the colored layers 6), the final coating (or encapsulating) layer being of the same nature as the intermediate layers 6' or of different nature.

In order to prevent the emergence of depressions and peaks in the formations 2' and to simultaneously promote the attachment of successive layers 6, 6' by physical imbrication with the accumulation of the layers 6 and 6, it is possible to shift two successive layers of the same type between them by a fraction, for example half or a third, of the pitch of the pattern, this in particular as a function of the total number of layers and the number of different substances deposited, the pattern being preferably the same for all the layers 6, 6'.

In order to promote adhesion between successive layers 6, 6', the method may consist in depositing each new layer 6, 6' before the preceding layer 6, 6' is completely crosslinked or solidified, especially when said previous layer still has a sticky effect on the surface, each layer being advantageously subjected immediately after depositing to an active and controlled crosslinking or solidification phase before application of the following layer 6, 6'.

Depending on the nature of the substance forming a layer 6, 6' and the row of this layer 6, 6' in the set of layers 6, 6' to be deposited, different modes of drying/curing/polymerization modes of the deposited droplets 4, 4' may be envisaged, if applicable before depositing of the following layer 6, 6':

- a curing/surface polymerization ("pinning": anchoring layer) for the primer layer, first primer layer or primary cover layer (white), and for the subsequently deposited layers of coloring sub stance;
- a core curing/polymerization[("curing")] of the layers of the first substance or functional layers 6' intermediated and final layers (varnishes);
- a final curing/polymerization phase of all deposited layers 6, 6', after depositing of the uppermost layer/overlay (last layer), in order to ensure the consistency of all the superimposed layers.

According to an embodiment of the invention providing optimized results, the method consists in depositing at least the first layer 6, preferably all layers 6, of coloring substance(s) in the form of several populations of droplets 4, 4' of different sizes or the same, applied simultaneously or successively to the face 1' of the body 1 to be printed and arranged in at least two complementary patterns 7, 7' complementary to one another, and forming together the pattern of the layer 6 in question.

These different populations of droplets can, of course, be deposited, for each layer 6, at the same time.

However, in accordance with a preferred variant of this embodiment, emerging in particular from FIGS. 3 and 4, the two populations of droplets 4 and 4' forming a layer 6 have different sizes and are deposited successively on the preceding layer 6'.

As can also be seen from the aforementioned figures, and according to an additional characteristic, the different droplets 4, 4' of coloring substance(s) of the same layer 6 (possibly belonging to different populations) are substantially adjoining one another, each population of droplets 4, 4' being arranged in a given pattern 7, 7', for example in mutually spaced or staggered lines, the pattern 1, 1' of the two populations of the same layer 6 being complementary, and the ratio of volumes between the droplets 4, 4' of the two populations being between 2 and 5, preferably on the order of 3.

In order to achieve a high-precision depositing, in particular with a well-defined spatial configuration, the method can consist, for each layer 6 of coloring substance(s), first of all depositing the droplets 4 of a small size, and then to cure or partially solidify the latter (congealing of their shape) and then to deposit the droplets 4' of a large size.

Advantageously, the method may furthermore consist of, for each new layer 6 of coloring substance(s), firstly depositing a first population of droplets 4 of small size according to a first determined depositing pattern 7, which extends over the entire intended area 5 for this new layer 6, and which comprises a plurality of zones disengaged between said droplets 4, in particular recessed from the lateral edges of said layer 6, enabling each to receive a large droplet 4' without overlapping with the droplets 4 of small size then, after at least partial curing of the small droplets 4, a population of large-size droplets 4' is deposited, according to a second determined depositing pattern 7', complementary to the first pattern 7 so as to cover, in a substantially continuous manner, the whole of the surface provided for this new layer 6 and to form, by combination, the pattern for depositing this layer 6.

According to an additional characteristic, as shown for example in FIGS. 1 and 2, it is possible to deposit droplets 4 of small size in an aligned manner along the outer lateral edges of each new layer 6 of coloring substance.

The patterns of small droplets 4 thus form a mesh, and possibly a peripheral frame, for positioning and holding the large droplets 4', preventing their displacement and spreading, and retaining their shape until they cure. The addition of the patterns 7 and 7' makes it possible to substantially continuously cover the whole of the surface, with a redundant covering from two colored layers 6.

When the coloring substances are UV inks (for example white, black, cyan, yellow, magenta), the droplets 4 can be frozen by UV (LED) drying and their complete curing, as well as that of the 4' droplets is obtained by UV curing.

In accordance with an optional feature of the invention, as shown for example in FIG. 2, it may be provided to deposit at least the first layer 6', preferably all the layers 6', formed from droplets 5 of the primary substance of the adhesion, attaching or covering type of agent, preferably transparent, according to the same procedure, in particular in terms of the size and arrangement of the droplets 5, as the layers 6 of coloring substance(s).

The technical and characteristic arrangements in terms of different populations of droplets, their arrangement in the deposition pattern and their deposition timing mentioned above in relation to the droplets 4, 4' of the second substance, can thus also be applied to the verified droplets of first substance.

Nevertheless, the layers 6' of [the] first substance of a structuring, adherent and protective nature (for example varnish or resin), may possibly be formed only of droplets of the same size (with a detached disposition between successive layers 6'—see FIGS. 1 and 5).

The method according to the invention also makes it possible to create structures in relief 2' having variable section profiles, compatible with the required structural cohesion requirements.

Thus, FIG. 1B shows a section of substantially rectangular shape.

Nevertheless, in view of the physical assaults to which these structures in relief 2' may be exposed, shapes without protruding angles or with progressive profiles are to be preferred.

Thus, although the various formations 2' attached to the face 1' may have sections with variable heights, lengths and lateral angles of attack α (with face 1'), it is preferable for the angle α (see FIG. 1) to be less than about 30°, preferably at most 20°.

The height of the formations 2' may meanwhile vary, in practice and as a function of the number of layers 6, 6' deposited, in the range from a few dozen μm to several hundred μm, depending on the number of layers 6, 6' deposited.

For this purpose, as shown by way of example in FIG. 5, it is possible to progressively reduce the surface size of the successive superimposed layers 6, 6', so as to obtain colored or transparent colored structures or formations 2', which have lateral faces inclined at an acute angle with respect to their base resting on the face 1'', so as to present sectionally according to a transverse vertical plane, a substantially triangular shape or in an arc of a circle: The material(s) of the layers 6' formed by the first or a third substance advantageously cover the laterally apparent border or edge 6'' of the layers 6 formed from the respectively first immediately underlying substance.

Nevertheless, flared profiles (that is to say having a lower height at the center than on the edges) can also be obtained with the method according to the invention, by providing for a management of the size of the droplets of the appropriate successive layers 6, 6'.

Depending on the circumstances of the process and the objective to be achieved, various parameters must be taken into account and calibrated beforehand.

Thus, the method may consist in adjusting beforehand the contact angle of the droplets 4, 4'; 5, the total number of layers 6, 6' superimposed and/or the number of droplets 4, 4'; 5 per unit area, to result in a desired height of structure or textured relief 2, the face 1 of the body 1 to be printed being advantageously subjected to a treatment, in order to adjust its surface tension before the depositing of the first layer 6, 6' of coloring substance(s) or first substance.

The droplets of the second or third substance typically have a single size, for example, a size identical to those of the large colored substance 4' droplets (FIGS. 1A, 1C and 1D).

By way of example, the large droplets 4' may, for example, have a volume of about 42 picoliters and the small droplets 4 a volume of approximately 14 picoliters.

The distance between the rows of droplets 4, 4' of the same type can be of the order of approximately 140 μm, for a printing density of 360 dpi.

With these values, the formations 2' shown in FIG. 1, comprising nine superposed layers, have a height of about 120 μm and a contact angle with the face 1' of about 20°.

In order to have a very pronounced relief and to obtain an intensity and a depth of color that is clearly superior to the state of the art, the method may advantageously consist of depositing at least five, preferably at least six or seven, successive layers 6, 6' of droplets 4, 4'; 5, alternating the coloring layers 6 and the transparent layers 6' formed from a first substance of the varnish or resin type, the last layer of the stack of layers 6, 6' being a transparent layer 6'.

Figure 5A:
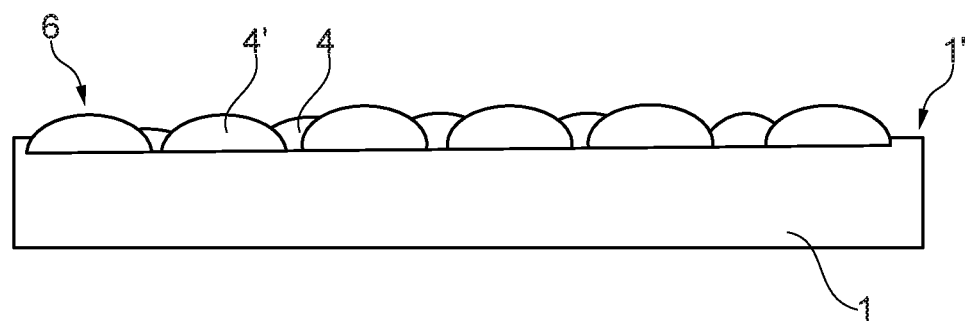
FIGS. 5A to 5I illustrate the principal successive steps of alternate deposits of droplet layers on the face of a body, to result in a colored, protruding formation, similar to those shown in FIG. 1A, a first step of applying a primer prior to the step shown in FIG. 5A, and/or a final step of covering the formation with a transparent protective layer (optionally using a substance identical to the one forming one of the two series of layers, or using another substance) after the step represented in FIG. 5I possibly being eventually provided (not shown)
Figure 5B:
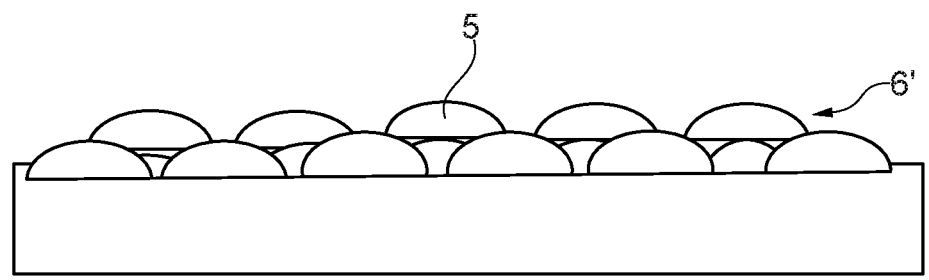
Figure 5C:
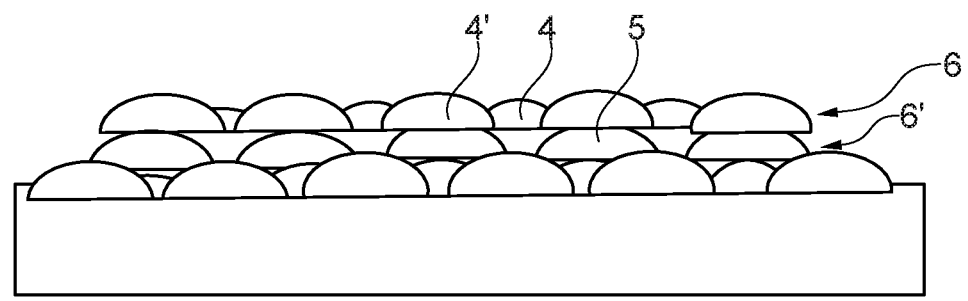
Figure 5D:
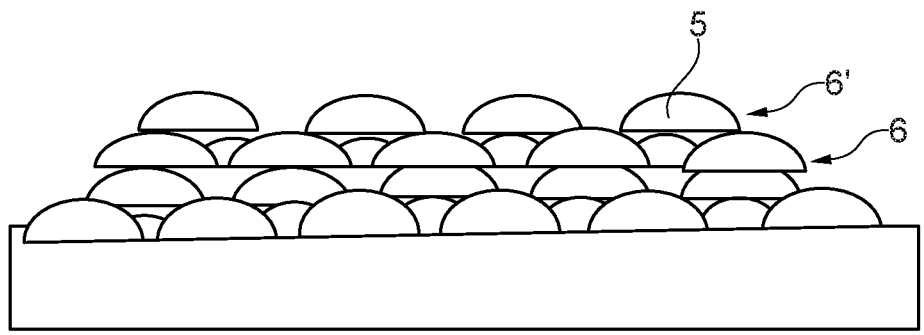
Figure 5E:
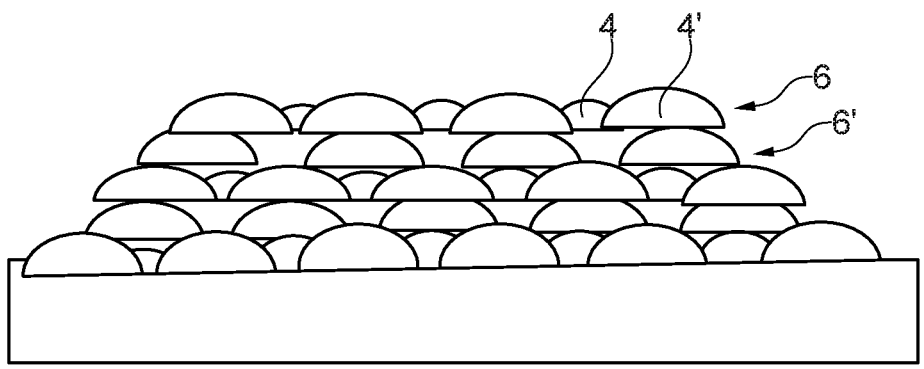
Figure 5F:
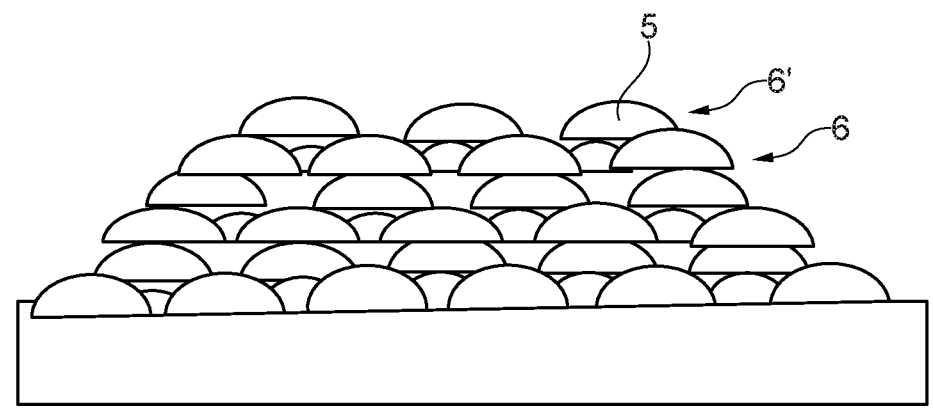
Figure 5G:
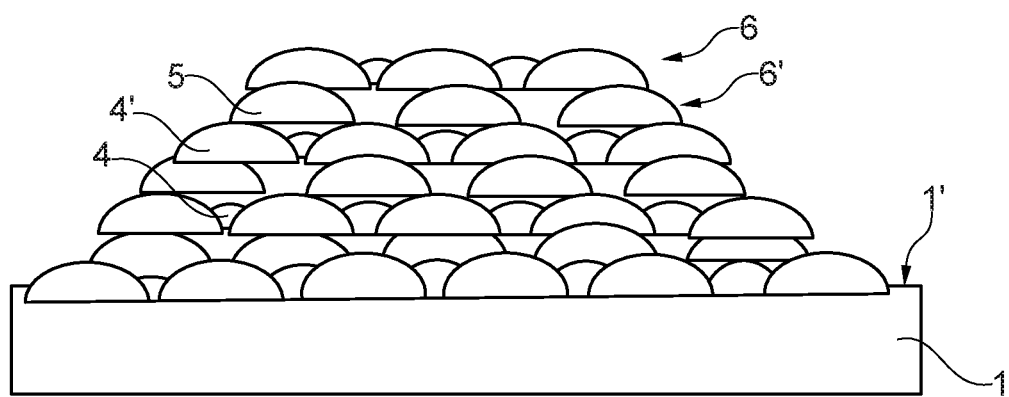
Figure 5H:
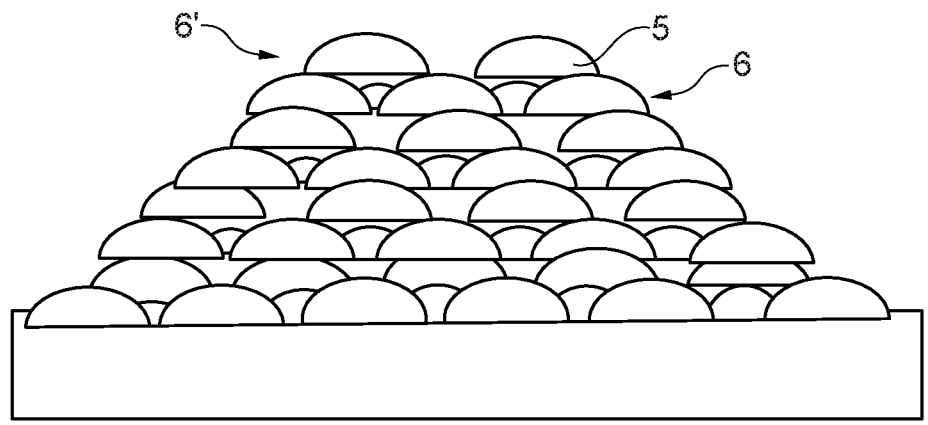
Figure 5I:
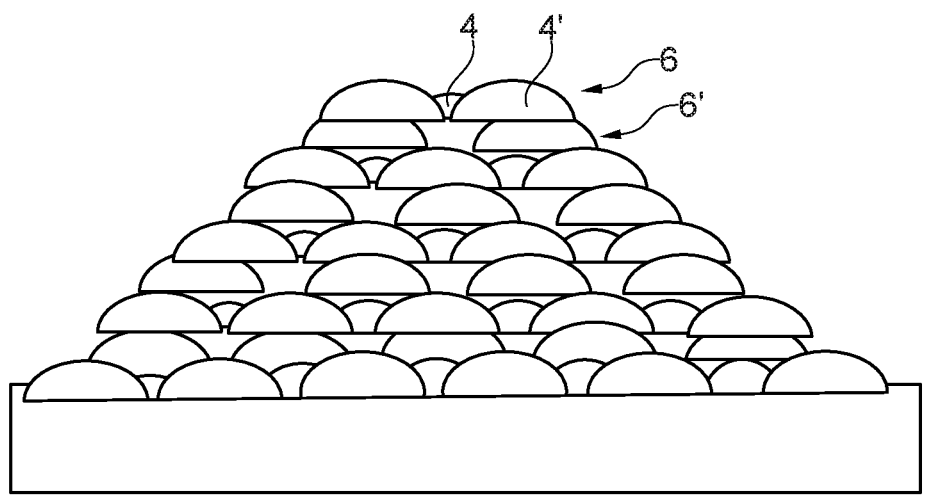

Such embodiments are illustrated by way of example in FIGS. 1 and 5I for relief heights up to several tenths of a millimeter or even at least one millimeter.

Thus, the invention makes it possible to provide precisely repeatable textured surfaces, corresponding precisely to a predefined desire in terms of visual rendering and configuration, profile and relief dimensions.

The information needed to produce the structured surface 2 can be provided in various ways, and can be presented in various forms, adapted for use by a suitable installation.

Preferably, it is possible to use predetermined digital printing files, and as a function of the desired structured surface 2, to produce the droplet patterns 4, 4'; 5 of each layer 6, 6' of colored substance(s) and/or of first substance, preferentially all the layers 6, 6', or the complementary patterns 7, 7' forming these motifs, and to optionally adjust other printing parameters specific to each or each of the layers 6, 6'.

The person skilled in the art understands that, depending on the desired result, in particular in terms of visual rendering (intensity of color, relief effects, matteness/gloss, etc.) and rendering to touch, it is easy to modify the various parameters involved in the formation of the colored, textured and structured surface. This adaptability is facilitated by the aforementioned implementation.

Thus, and also in connection with the invention, the method may furthermore consist of, for the formation of successive superimposed layers 6, 6', providing and implementing depositing patterns 7, 7' sizes or distributions of droplet populations 4, 4'; 5 and/or drying modes or intensities which are specific to each layer 6, 6', at least one of these parameters being different between certain layers 6, 6', preferably different for each layer 6, 6.

It is well understood that each of the aforementioned parameters may or may not be modified independently of the others and for one, several or all of the layers 6, 6'.

For drying in particular, various parameters can be adjusted, namely the radiation power, the nature of the latter (for example UV A, B or C), duration of exposure, etc., the important variable being the dose of radiation received by each of the layers 6, 6'.

Furthermore, it can also be provided that the coloring substances forming the droplets 4, 4' of the colored layers 6, have different levels of colored pigments or color intensities between the different layers 6.

The invention can advantageously provide a three-dimensional representation of the face 1' (to print) of at least the body 1, preferably by acquiring its shape while said body 1 is installed on a support device 8, used during printing, for example by 3D laser scanning, before setting up the digital printing files, in particular for processing a series of identical bodies 1.

Concerning the practical implementation of the method, the latter may consist of depositing all of the droplets 4, 4'; 5 of the different layers 6, 6' with a single composite printing head 3' or an arrangement of several distinct print heads 3', comprising a number of ejection orifices calibrated and controlled according to the nature and amount of substance to be sprayed, said printing head or arrangement on the one hand and said printing face 1' on the other, which can be displaced relative to one another in at least two mutually perpendicular directions, possibly three mutually perpendicular directions when the printing face 1' is non-planar, the ejection of droplets 4, 4'; and the relative movements being controlled and monitored on the basis of information from digital printing files, for example.

The invention also relates, as shown by way of examples of various alternative embodiments of FIGS. 6A to 11A, to a printing installation in relief for implementing the aforementioned method.

According to the invention, this installation comprises, on the one hand, a device 3 for depositing by spraying in the form of droplets 4, 4'; 5 of a first substance selected from the group consisting of a primer, a varnish, an adhesion or bonding agent and a coating agent, preferably white or transparent, and preferably of at least one second substance of the coloring substance type or mixture of coloring substances. This projection device 3 comprises a single composite printing head 3' or an arrangement of several distinct print heads 3', each comprising a number of calibrated and controlled ejection orifices depending on the nature and amount of the substance to be sprayed. The installation comprises, on the other hand, a support device 8 for the body 1 whose visible face 1' is to be printed and, finally, suitable hardware and software means to ensure control of the projection and a relative and controlled displacement between the projection device 3, more precisely the head or heads 3' thereof, and the support device 8 in an amplitude and in directions fixed by the structured surface to be obtained.

FIGS. 6 to 10 illustrate schematically various alternative embodiments of an installation for implementing the ink jet relief printing method according to the invention.

The printing operation itself may be preceded by operations for preparing the face 1' of the body 1, provided or not provided with an initial paint layer, a skin or the like.

Thus, a deionization treatment, followed by a treatment, for example by electric flame, flame, corona, plasma, UV or by application of a primer, to adjust the surface tension (wettability) and thus to control the contact angle of the droplets of the at least the first layer. Also, after the printing operation, at least one firing/drying operation can be provided.

All of these treatments can be carried out in a cabin also containing the inkjet printing installation.

Furthermore, the preparatory phases also advantageously comprise the production of the digital printing files by acquisition of the 3D shape of the body 1 (for example movement of the body during a laser scanning), and then mapping a decoration, image or the like in the form of a file onto the digital representation of the face 1' of the body 1, possible fret work of the virtual hybrid representation (in corresponding zones on different sides of the body 1) and obtaining digital printing files that can be used by the installation. Finally, one or more final posterior operations of varnishing or surface resins may also be provided, capable of covering the formations 2', and possibly all of the face 2', with a transparent protective layer, in addition to or in place of a last layer 6' of second substance applied by the inkjet printing installation according to the invention.

In this respect FIGS. 6A and 6B illustrate a first constructional variant in which the body 1 is carried by a robot 8 with six spindles and is moved in the XZ plane at a constant distance from the printing head 3' (for example 3 mm), this head 3' being displaced by a linear motor along the Y axis (for example, the definition of printing bands is 10 mm wide).

Figure 7B:
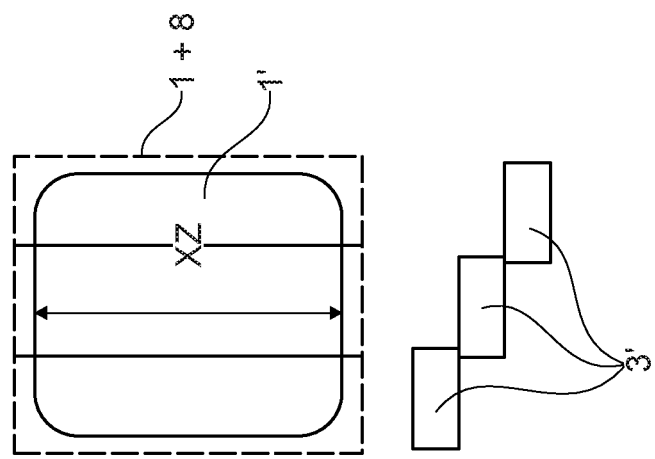
Figure 7A:
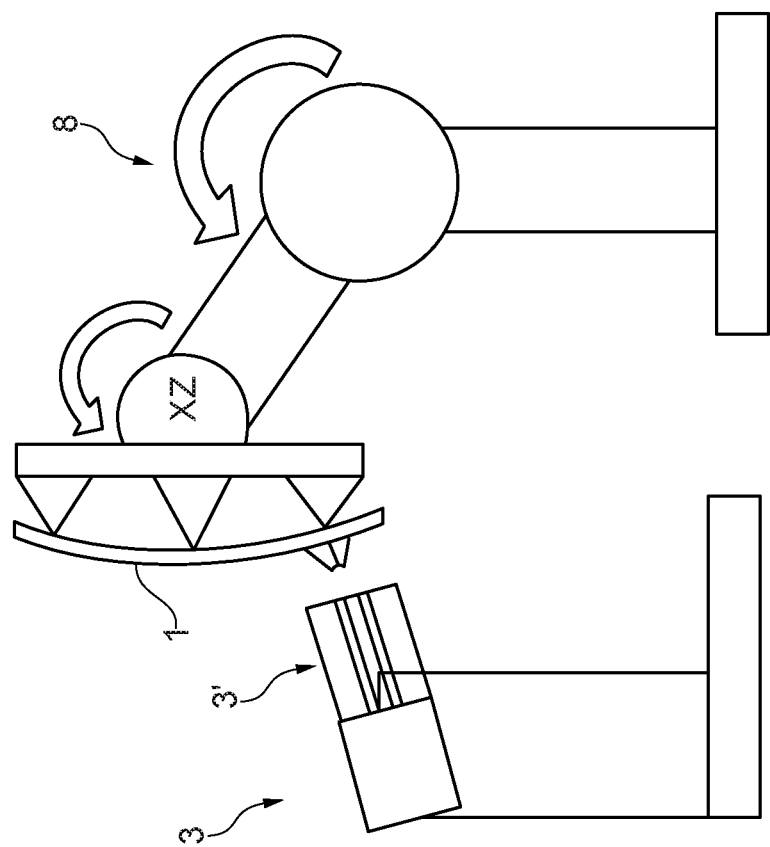

In FIGS. 7A and 7B, the body 1 is moved by the robot arm 8 with six spindles as in the example of FIGS. 6A and 6B. On the other hand, the printing heads 3' with a large printing width remain fixed and together cover the width of the area to be printed from the face 1'.

Figure 8B:
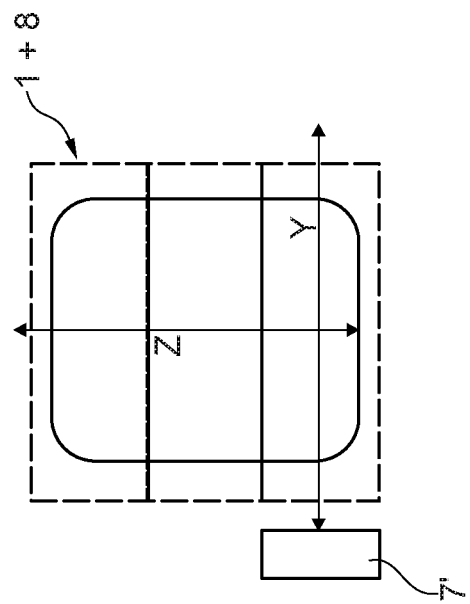
Figure 8A:
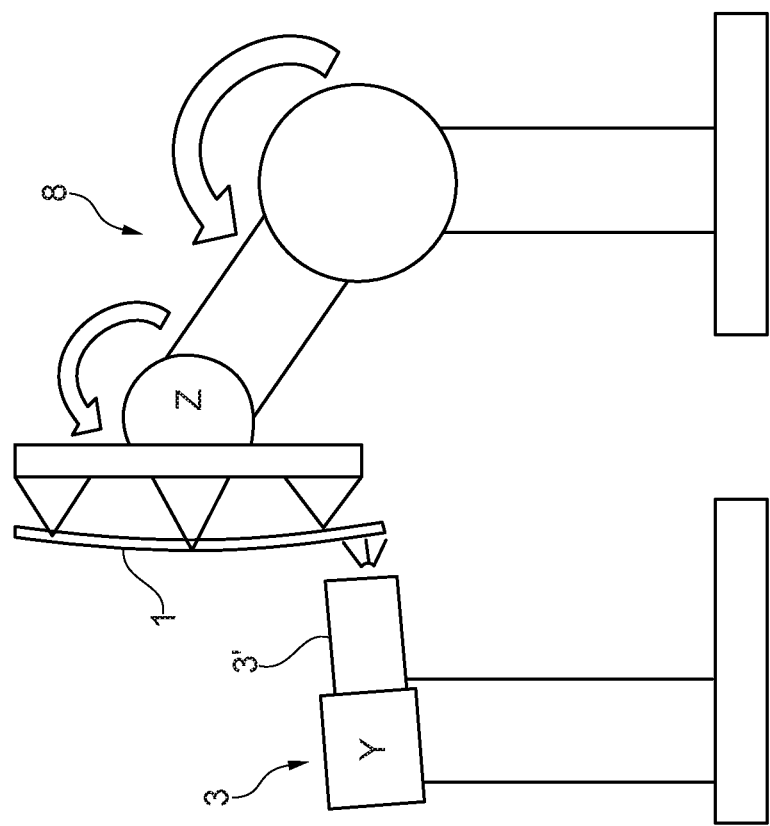

In FIGS. 8A and 8B, the six-spindle robot arm 8 moves the body along the Z axis by incrementation (10 mm band), while the printing head 3' performs a reciprocating scan according to the Y axis.

In the example of FIGS. 9A and 9B, the robot arm 8 with three spindles moves the body 1 in the XZ plane (keeping the distance with the projection device), while the different printing heads 3' carry out the depositing of the droplets 4, 4' or 5 of a layer 6 or 6' or of a pattern 7 or 7' in a single pass along the Y axis, over the entire area of the face 1 to be printed.

In the example of FIGS. 10A and 10B, the body 1 is fixedly mounted on a static support, and the device for depositing by spraying 3 with one or more printing heads 3' is mounted on a robot arm 8 comprising between 3 and 6 spindles, as a function of the three-dimensional shape of the face 1' to be printed. This embodiment of the installation is particularly suitable for printing a limited area 10 only of the body 1.

Finally, in the example illustrated in FIG. 11A, the body 1 is mounted movably on a support means, 8 enabling a movement in the space of the said body 1, the multiple printing head 3' being able to remain fixed.

Figure 12:
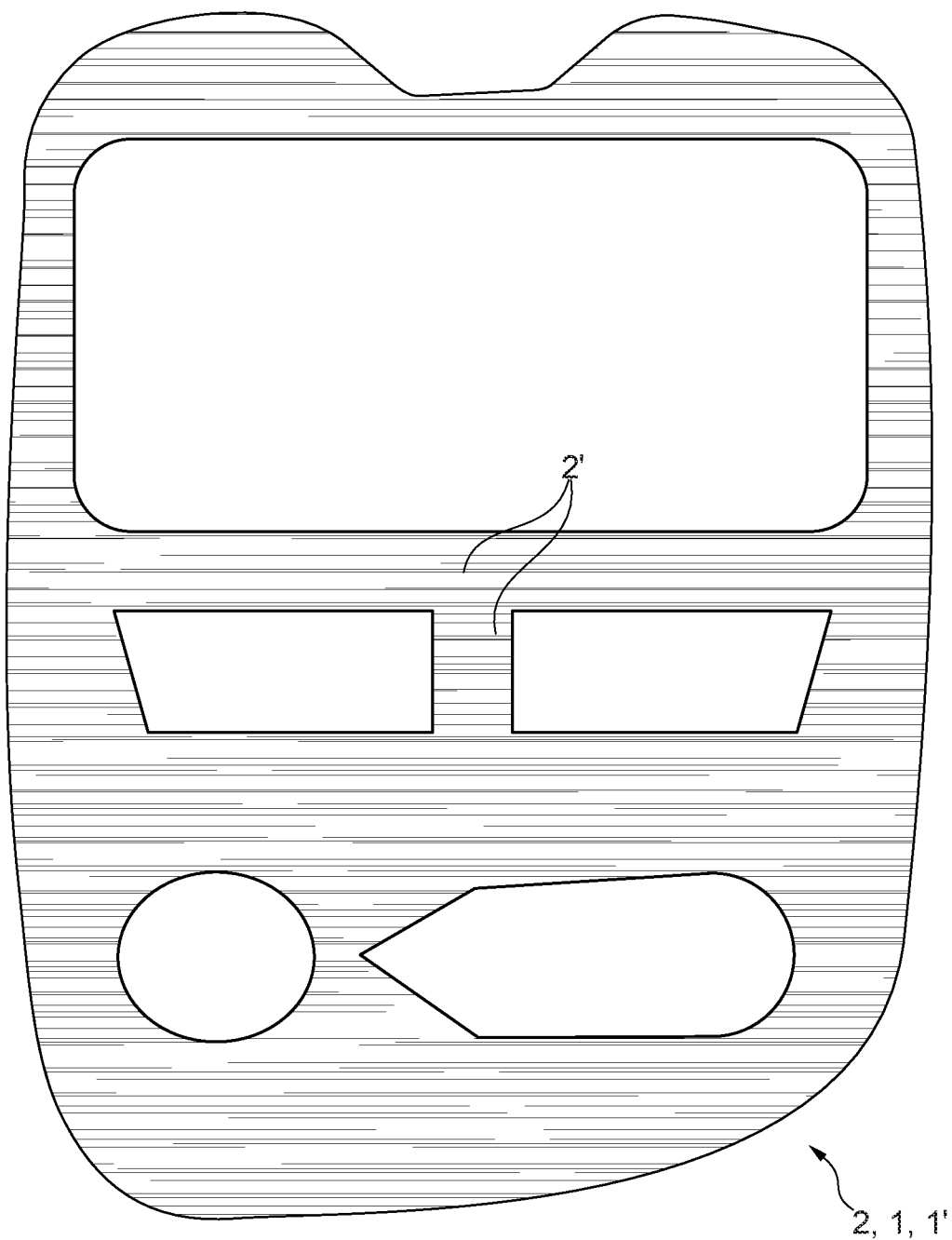

Finally, the invention also provides, as shown partially in FIGS. 1, 2 and 12, a functional and/or decorative part, in particular an interior decoration part of a motor vehicle, comprising a base body or substrate 1 and, at the level of its visible face F, a textured and possibly colored surface 2, characterized in that the textured surface 2 is obtained by means of the method described above, preferably using the aforementioned installation.

Such a part may, for example, comprise a bare substrate, covered with a skin or a layer of paint, constituting the body 1 with its visible face 1' on which the structured surface 2 is formed.

The type of parts referred to may comprise, for example: cover plates, wheel discs, rods, bands, dashboards, integrated equipment faces or the like.

As an example of depositing layers 6, 6' n relation to the method according to the invention, it is possible, for example, to provide (possibly in connection with the use of a Kinolta Minolta print head):

for a layer of white covering: 360 DPI, droplets of 21 or 42 pL;
for a color layer (CMYK or CMYK): 75 DPI, droplets of 18 pL;
For a layer of varnish: 360 DPI, droplets of 42 pL.

The spacing between droplets of the same pattern may be on the order of 140 μm for example.

Concerning the drying phase with a vue towards curing/polymerization of the droplets 6, 6' of the various layers, it is possible to provide:

for the "pinning": a power of about 5 W/cm$^2$;
for a core treatment: a power of about 12 W/cm$^2$
for a final treatment of all the layers: a power of about 160 W/cm$^2$ The other adjustment parameters of the material and the process are within the domain of the professional knowledge of the person skilled in the art.

Various tests and essays carried out with parts obtained by implementing the method according to the invention, have shown the advantageous properties and the performances of the textured surfaces comprising embossed formations, made according to the invention with at least two, preferably with at least three superimposed layers.

Thus, among the positive results of conformity tests for applications in the automotive field (interior coating), we can mention in particular:

resistance to scratching by abrasion (in particular according to D42 1775—version currently in force);
resistance to scratching by brightening (in particular according to D44 1900—version currently in force);
resistance to friction (duration: 2 hours—in particular according to D14 1055—version currently in force);
resistance to grid testing (verification of adhesion—in particular according to D25 1075).

The evaluation of these tests was carried out using the gray scale according to NF EN 20105 A 025.

The essays and tests carried out also made it possible to observe, in the above-mentioned examples, a difference (increase) in matteness as a function of an increasing number of deposited layers.

A certain degree of brightness, or even the initial brightness of the first layer or surface, can be obtained at the level of the colored layers beyond the first layer, by modifying the droplet depositing pattern and/or the parameters or conditions of drying and curing.

Likewise, the degree of matteness can be managed by controlling the drying and the size of the droplets deposited, as well as by the configuration of the starting patterns of the successive layers. In particular, the density of the droplet depositing points and/or their distribution in successively deposited droplet patterns forming a permanent layer motif, results in layers with a more or less matte/glossy appearance and texture.

Of course, the invention is not limited to the embodiments described and shown in the accompanying drawings. Modifications remain possible, in particular from the point of view of the constitution of the various elements, or by substitution of technical equivalents, without thereby departing from the field of protection of the invention.

The invention claimed is:

1. A method of coating or covering of a visible face of a body with formation or realization of a structured surface comprising protruding formations, the protruding formations being produced by superimposed accumulation of layers deposited successively by a device for depositing a substance or substances in droplets,
said method including successively depositing at least three superposed layers, each layer being formed of individual and distinct droplets arranged in each layer according to a motif, and depositing each new layer before the preceding layer is completely cured or solidified,
wherein the droplets are deposited individually and distinctly with a predetermined shift of the depositing motif between consecutive layers,
wherein the superimposed layers are constituted successively and alternately of a first substance and a second substance, wherein the first substance forms a layer of varnish or transparent resin and the second substance forms a layer of coloring substance.

2. A method according to claim 1, wherein a first layer deposited on the face to be coated is a layer formed of droplets of the first substance.

3. A method according to claim 1, wherein a last deposited layer or top layer is a layer formed of droplets of the first substance or a third substance.

4. A method according to claim 1, wherein the depositing motifs of two successive layers of the same type are shifted from one another by a fraction of the motif's pitch.

5. A method according to claim 1, wherein each new layer is deposited when said previous layer still has a sticky effect on the surface, each layer being subjected immediately after depositing to an active and controlled phase of curing or solidification before application of the next layer.

6. A method according to claim 1, wherein at least a first layer of the coloring substance is deposited in the form of several populations of droplets of different sizes or not, applied simultaneously or successively on the face of the body, to be printed and arranged in at least two complementary, nested patterns, one in the other and forming together the motif of the layer under consideration.

7. A method according to claim 6, wherein two of the droplet populations forming a layer of the coloring substance have different sizes and are deposited successively on the preceding layer.

8. A method according to claim 6, wherein the different droplets of the coloring substance of the same layer are substantially adjacent to each other, each population of the droplets of the same layer is arranged in a pattern, the populations are complementary, and the volume ratio between the droplets of the two populations is between 2 and 5.

9. A method according to claim 6, wherein for each new layer of coloring substance, small droplets are first deposited, followed by curing or partial solidification of the latter, and then depositing large droplets.

10. A method according to claim 6, wherein for each new layer of coloring substance, it consists of an initial population of droplets being initially deposited, first depositing a preliminary population of small droplets according to a previously determined depositing pattern, which extends over the entire area provided for this new layer, and which comprises a number of small droplet zones disengaged between said droplets, recessed from the lateral edges of said layer, allowing each to receive a large droplet without overlapping with the small droplets and then depositing, after at least partial curing, small droplets, a population of large droplets, according to the first pattern so as to cover, in a substantially continuous manner, the whole of the surface provided for this new layer and to form by combining the motif depositing this layer.

11. A method according to claim 6, wherein small droplets are deposited in alignment along the outer lateral edges of each new layer of coloring substance.

12. A method according to claim 6 further including depositing at least a first layer formed of droplets of a primary substance of an adhesion, bonding or covering type of agent according to the same operating procedure.

13. A method according to claim 1, wherein the surface size of successive superposed layers is gradually reduced, so as to obtain structures in relief, colored or transparent, which have lateral faces inclined at an acute angle to their base resting on the face, so as to present in cross-section, in a transverse vertical plane, a shape substantially triangular or circular arc; the material of the layers formed by the first or a third substance, respectively covering the laterally visible edge or edge of the layers, formed from the first substance immediately underlying.

14. A method according to claim 1, wherein the contact angle of the droplets is previously set, the total number of superimposed layers and/or the number of droplets per unit area to result in a desired height of structure in relief or textured, the face of the body to be printed being subjected to a treatment in order to adjust its surface tension prior to the deposition of a first layer of the coloring substance or a primary substance.

15. A method according to claim 1, wherein at least five successive layers of droplets, by alternating the coloring layers and the transparent layers formed from a first substance of the varnish or resin type, the last layer of the stack of layers being a transparent layer.

16. A method according to claim 1, wherein for the formation of the superimposed successive layers, it is possible to provide and apply depositing motifs, of sizes or distributions of droplet populations and/or drying modes or intensities which are specific to each layer, at least one of these parameters being different between certain layers.

17. A method according to claim 1, wherein the coloring substances forming the droplets of the colored layers reflect colored pigment levels of different color intensities between the different layers.

18. A method according to claim 1, including using pre-established digital printing files, and a function of the desired structured surface, or forming the droplet motifs of each layer of colored substance and/or primary substance, or the complementary patterns forming these motifs, and for possibly adjusting other printing parameters specific to each or to certain of the layers.

19. A method according to claim 18, including providing a three-dimensional representation of at least the face to be printed on the body while said body is installed on a support device used during printing prior to setting up the digital printing files.

20. A method according to claim 1 including depositing all the droplets of the individual layers with a single composite printing head or an arrangement of a number of separate printing heads or an arrangement of a number of separate printing heads, comprising a number of ejection orifices, calibrated and controlled depending on the nature and amount of substance to be sprayed, said printing head or said arrangement on the one hand and said printing face on the other hand, which can be displaced relative to one another in at least two mutually perpendicular directions, if necessary three mutually perpendicular directions when the face to be printed is non-planar, the ejection of droplets and the relative movements, for example, being controlled and monitored on the basis of information from digital printing files.

* * * * *